US006975043B2

(12) United States Patent
Schumacher et al.

(10) Patent No.: US 6,975,043 B2
(45) Date of Patent: Dec. 13, 2005

(54) PRESSURIZED GAS TO ELECTRICAL ENERGY CONVERSION FOR LOW-POWER FIELD DEVICES

(75) Inventors: Mark S. Schumacher, Minneapolis, MN (US); Gregory C. Brown, Chanhassen, MN (US)

(73) Assignee: Rosemount, Inc., Eden Prairie, MN (US)

( * ) Notice: Subject to any disclaimer, the term of this patent is extended or adjusted under 35 U.S.C. 154(b) by 0 days.

(21) Appl. No.: 10/745,310

(22) Filed: Dec. 22, 2003

(65) Prior Publication Data
US 2005/0134047 A1 Jun. 23, 2005

(51) Int. Cl.$^7$ ................................................ H02P 9/00
(52) U.S. Cl. .................... 290/1 R; 310/15; 310/314
(58) Field of Search .................... 290/1 R; 310/15, 310/314

(56) References Cited

U.S. PATENT DOCUMENTS

| | | | | |
|---|---|---|---|---|
| 2,895,063 A | * | 7/1959 | Morris | 310/15 |
| 3,568,704 A | * | 3/1971 | Campagnuolo et al. | 310/15 |
| 3,663,845 A | * | 5/1972 | Apstein | 310/15 |
| 3,798,475 A | | 3/1974 | Campagnuolo et al. | 310/15 |
| 3,878,716 A | | 4/1975 | Asada | 73/194 |
| 4,005,319 A | * | 1/1977 | Nilsson et al. | 310/339 |
| 4,148,215 A | * | 4/1979 | Hofstetter, Jr. | 73/54.23 |
| RE31,217 E | * | 4/1983 | Rodely | 73/861.22 |
| 4,491,738 A | | 1/1985 | Kamp | 290/43 |
| 4,536,674 A | * | 8/1985 | Schmidt | 310/330 |
| 5,965,968 A | | 10/1999 | Robert et al. | 310/310 |
| 6,058,787 A | * | 5/2000 | Hughes | 73/861.63 |
| 6,127,765 A | * | 10/2000 | Fushinobu | 310/306 |
| 6,127,812 A | | 10/2000 | Ghezzo et al. | 320/166 |
| 6,315,813 B1 | * | 11/2001 | Morgan et al. | 95/23 |
| 6,470,755 B1 | * | 10/2002 | Beachey et al. | 73/756 |
| 6,593,666 B1 | | 7/2003 | Pinkerton | 290/1 R |
| 6,595,006 B2 | | 7/2003 | Thiesen et al. | 62/6 |
| 6,651,511 B1 | * | 11/2003 | Young | 73/861.08 |
| 6,713,942 B2 | * | 3/2004 | Raman et al. | 310/316.01 |
| 2002/0036448 A1 | | 3/2002 | Kageyama et al. | 310/348 |

FOREIGN PATENT DOCUMENTS

| | | |
|---|---|---|
| DE | 102 05 531 A1 | 8/2003 |
| EP | 1 071 195 A2 | 1/2001 |
| GB | 2111680 A * | 7/1983 |
| GB | 2119514 A * | 11/1983 |
| GB | 2121185 A * | 12/1983 |
| GB | 2142725 A * | 1/1985 |
| WO | WO 03/056691 A1 | 10/2003 |
| WO | WO 03/056692 A1 | 10/2003 |

OTHER PUBLICATIONS

"Green" Eureka, Findlay Publications Ltd., vol., 20, No. 10, Oct. 2000, pp. 30-31.

* cited by examiner

Primary Examiner—Joseph Waks
(74) Attorney, Agent, or Firm—Westman, Champlin & Kelly, P.A.

(57) ABSTRACT

An industrial process field device with improved power generation is provided. The process device can be a process variable transmitter, process actuator, or any other suitable field device. The field device includes a wireless transceiver that transceives information related to the process via a wireless medium. A power supply within the field device is couplable to a source of pressurized gas and generates motion within the power supply that is translated into electrical energy. This electrical energy is then used to operate the field device.

33 Claims, 7 Drawing Sheets

PRIOR ART

PRIOR ART

PRESSURIZED GAS TO ELECTRICAL ENERGY CONVERSION FOR LOW-POWER FIELD DEVICES

FIELD OF INVENTION

The present invention is related to process control and measurement field devices such as transmitters and actuators. More specifically, the present invention is related to relatively low-power field devices.

BACKGROUND OF THE INVENTION

Field devices, also referred to herein as process devices, are used by the process control and measurement industry for a variety of purposes. Usually such devices have a field-hardened enclosure so that they can be installed outdoors in relatively rugged environments and are able to withstand climatalogical extremes of temperature, humidity, vibration, mechanical shock, etc. These devices also can typically operate on relatively low power. For example, field devices are currently available that receive all of their operating power from a known 4–20 mA loop. These devices are able to not only operate upon the loop but communicate over the loop both with analog signals (actually modulating the 4–20 mA signal) and digitally.

One example of a field device is known as a process variable transmitter. Transmitters sense a process parameter such as pressure, temperature, flow, pH, conductivity, turbidity, etc. and provide a signal over the process communication loop (such as a 4–20 mA loop) that is indicative of the sensed process variable. Process actuators are similar to process variable transmitters in that they generally have a relatively field-hardened enclosure and communicate upon a process control and measurement loop. Process actuators, however, actually affect the process based upon signals received from the loop. Other field devices can include process control modules, process alarm modules, process diagnostic modules, et cetera.

In some process control plants, or in remote measurement stations, it is often useful to provide a transmission of the process variable data by means other than over a copper-wire process communication loop. Usually, a wireless communication is used for such applications. Temporary or add-on process variable monitoring would also benefit from a wireless installation.

For a wireless installation, data is usually transmitted in bursts. During these transmission bursts, relatively significant operating power is required (in excess of 100 milliwatts). During the dwell time between the transmission bursts, the device generally goes into a low-power measurement mode consuming less than 10 milliwatts. In some applications, the unit goes into a sleep mode between measurements. This sleep mode can have an operating power on the order of the microwatts. When process variable measurement is required, or information is required to be transmitted, the unit will then wake up and perform the requisite action.

One pervasive problem for remote, wireless measurement and control applications is providing a reliable, self-contained power source capable of providing adequate power for measurement and transmission. Presently, batteries, or combinations of batteries and solar panels are used by these devices. These approaches have drawbacks because the batteries need changing, or the solar panel sometimes does not receive enough light to adequately charge the back-up batteries. Eventually under these low-light conditions, the measurement and transmission schedule is interrupted due to low batteries. For example, in some geographical locations, low-light conditions can exist, during some seasons, for substantially the entire day.

Providing a power source for wireless remote process installations that does not require either sunlight, or periodically changing batteries would significantly benefit the art.

SUMMARY OF THE INVENTION

An industrial process field device with improved power generation is provided. The process device can be a process variable transmitter, process actuator, or any other suitable field device. The field device includes a wireless transceiver that transceives information related to the process via a wireless medium. A power supply within the field device is couplable to a source of pressurized gas and generates motion within the power supply that is translated into electrical energy. This electrical energy is then used to operate the field device.

DETAILED DESCRIPTION OF THE PREFERRED EMBODIMENTS

Figure 1:
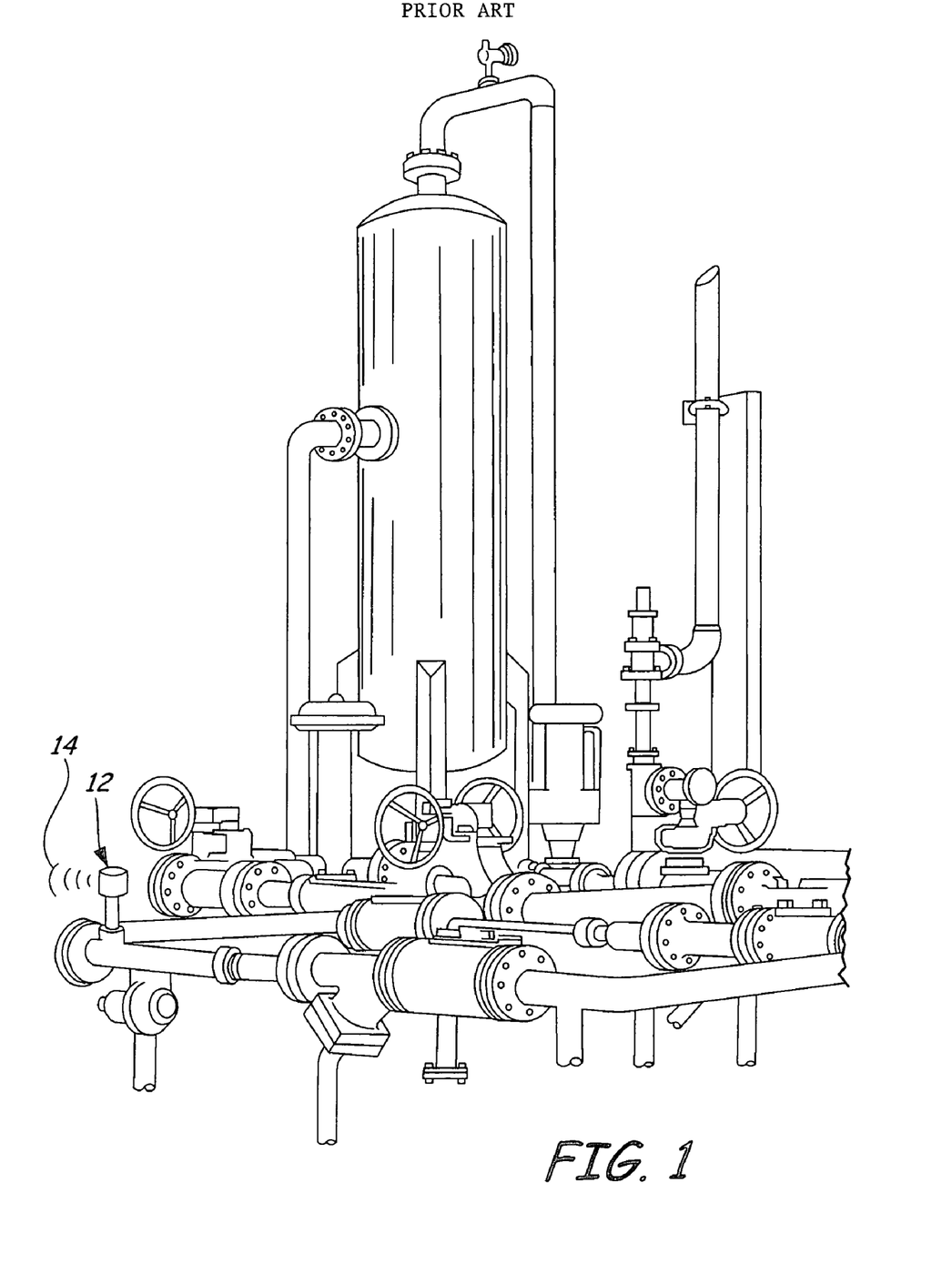
FIG. 1 is a diagrammatic view of an industrial process environment in which embodiments of the present invention are particularly useful.

FIG. 1 is a diagrammatic view of a process industry installation employing a field device shown in this example as a process variable transmitter 12 physically coupled to the process and providing a wireless signal 14 indicative of at least one process variable.

Figure 2:
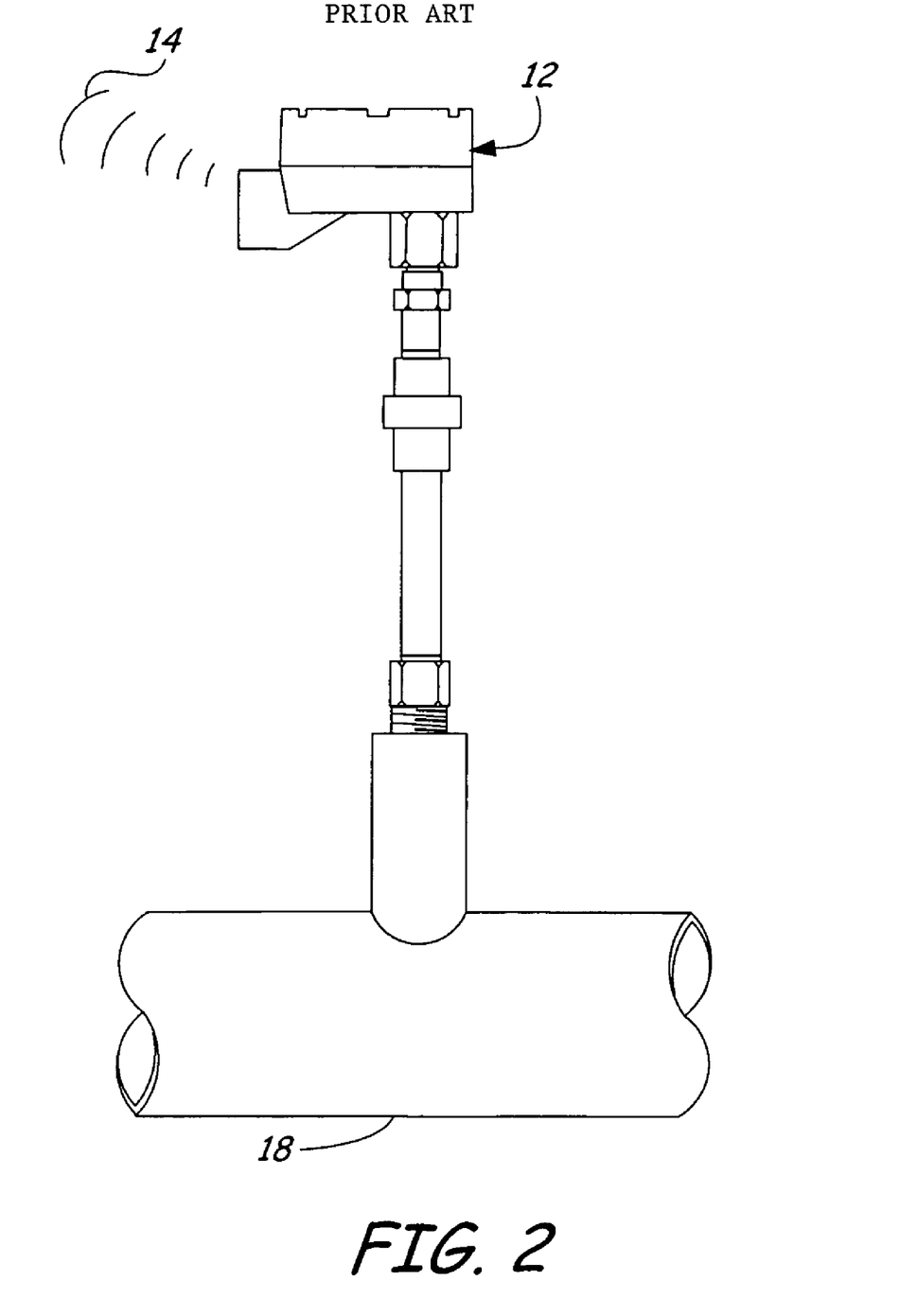
FIGS. 2 and 3 are diagrammatic view of field devices in which embodiments of the present invention are particularly useful.
Figure 3:
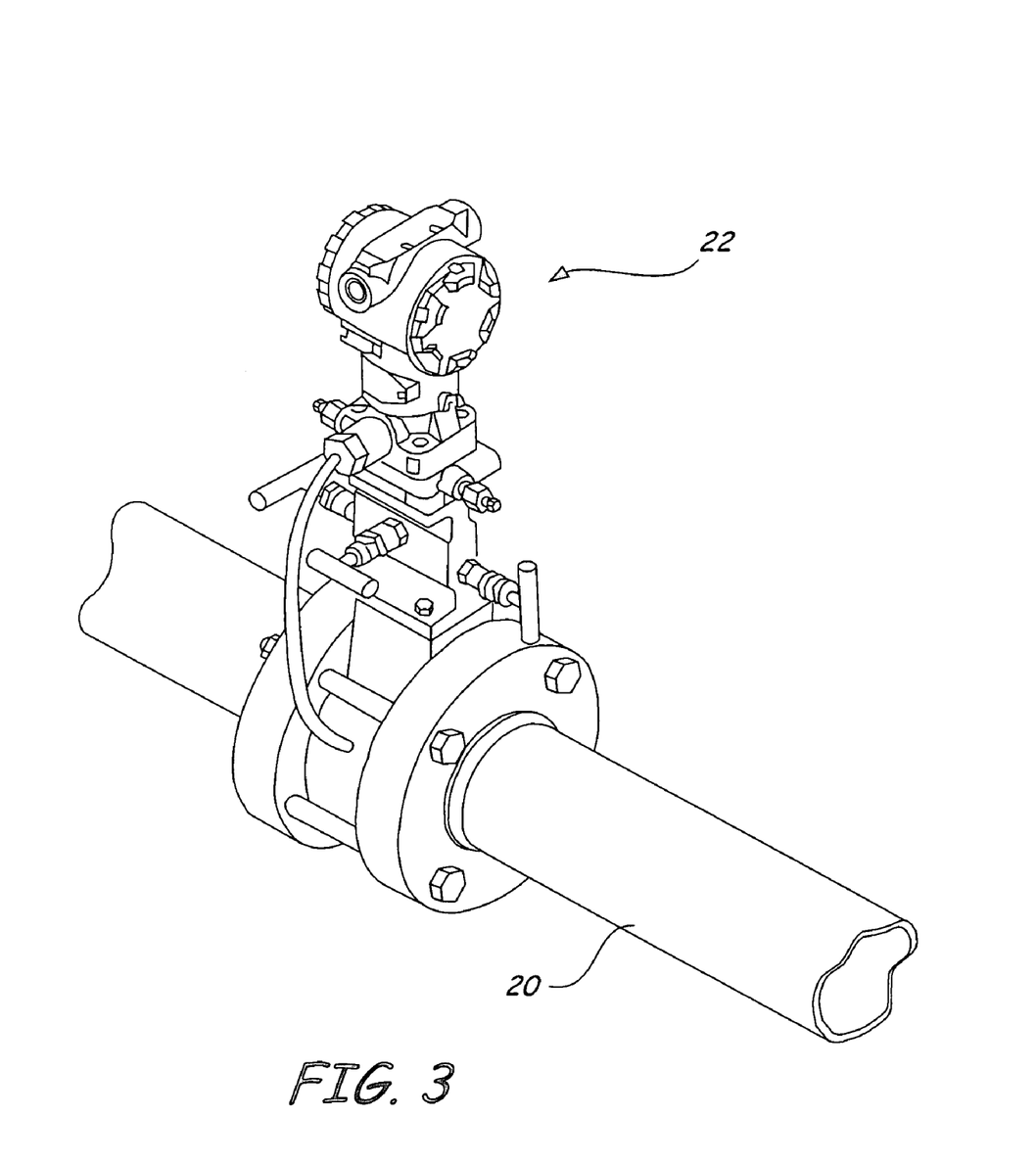

FIGS. 2 and 3 are diagrammatic views of exemplary process variable transmitters with which embodiments of the present invention are particularly useful. FIG. 2 illustrates temperature transmitter 12 coupled to process container (pipe) 18 such that transmitter 12 can measure the temperature of process fluid therein.

FIG. 3 is a diagrammatic view of process fluid flow transmitter 22 coupled to process container 20, which transmitter 22 measures a differential pressure across a flow obstruction interposed within container 20 and calculates process fluid flow based upon the measured differential pressure. Process variable transmitters 12 and 22 are specific examples of types of field devices that can advantageously employ embodiments of the present invention. Those skilled in the art will recognize that embodiments of the present invention can be practiced with any field device including process variable transmitters, process actuators, and other suitable devices, that couples to a process.

Embodiments of the present invention generally employ or utilize a source of pressurized gas and convert that pressurized gas to electrical energy for use by the field device. In some embodiments, for example, the embodiment illustrated in FIG. 3, it may be possible for the source of pressurized gas to be the process fluid itself. In other embodiments, a separate source of pressurized gas (in the form of an external tank of pressurized gas) can be coupled to the field device.

Figure 4:
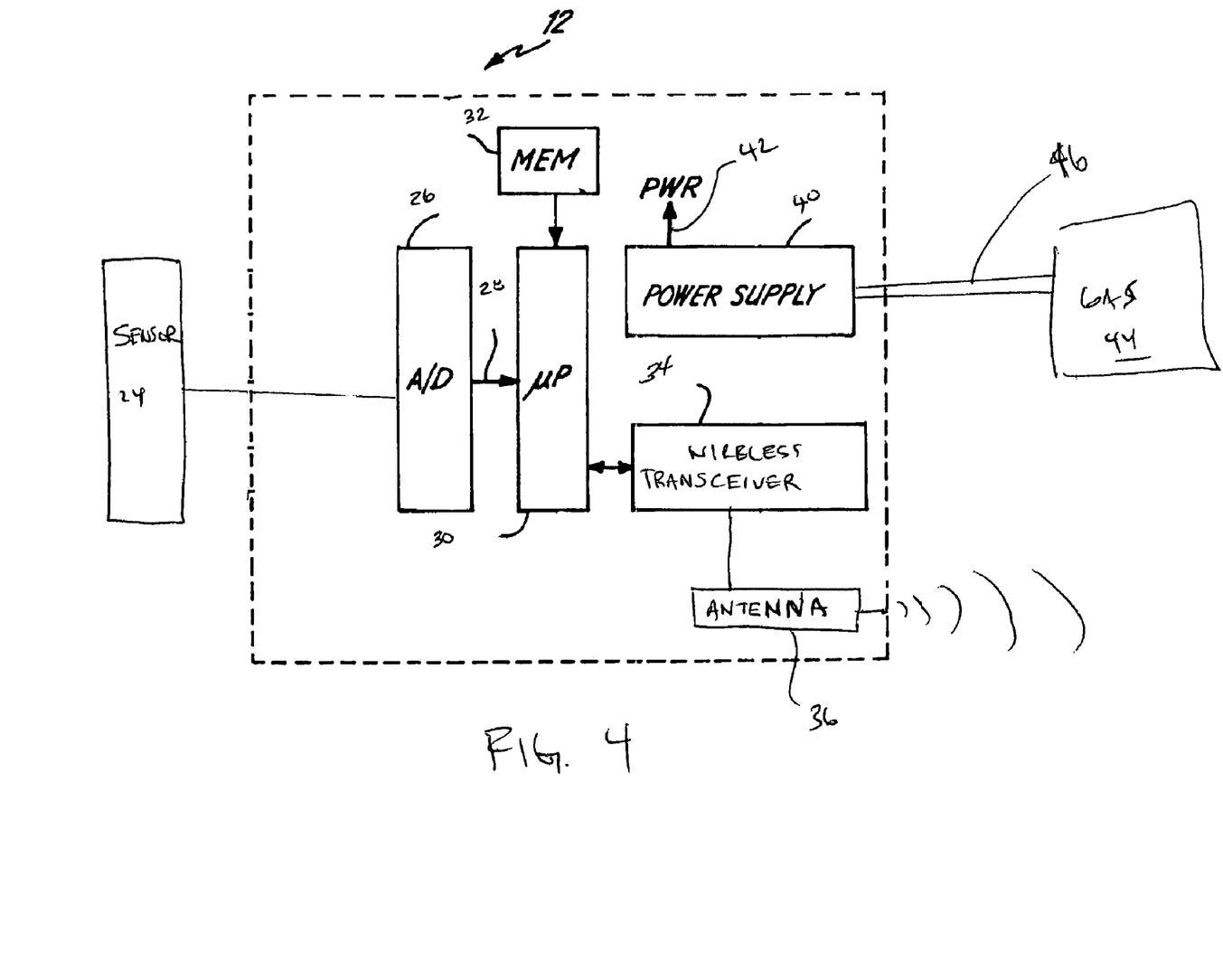
FIG. 4 is a block diagram of a process variable transmitter for which embodiments of the present invention are particularly useful.

FIG. 4 is a diagrammatic view of a process variable transmitter, such as transmitter 12, illustrating the basic elements of the transmitter. Transmitter 12 is generally coupled to a process variable sensor 24 that generates a signal indicative of a process variable, such as process fluid temperature, process fluid pressure, etc. Sensor 24 is coupled to analog-to-digital converter 26 which converts the analog signal from sensor 24 to a digital value and passes the digital value through bus 28 to microprocessor 30. Microprocessor 30 executes a program, preferably stored in memory 32 and generates a process variable output signal based upon the digital value provided to microprocessor 30 through bus 28. This process variable output is provided to wireless transceiver 34, which is coupled to antenna 36. Antenna 36 and wireless transceiver 34 cooperate to provide wireless interaction with one or more suitable devices. Illustratively, wireless transceiver 24 is a transceiver that can employ either radio-frequency or optical techniques for wireless communication. In order to conserve power, transmitter 12 will preferably transmit data in bursts. During these transmission bursts, relatively significant operating power is required (potentially in excess of 100 milliwatts). This is to ensure that sufficient energy is put into the wireless transmission to provide quality communication and range.

In order to provide power to the components within process variable transmitter 12, power supply module 40 is provided. Power supply module 40 is coupled to all electrical components within process variable transmitter 12 as indicated by line 42 labeled PWR. As will be described in greater detail below, power supply module 40 is fluidically coupled to a source of pressurized gas 44 via line 46. The source of pressurized gas 44 and line 46 can, in some embodiments, be a part of the process variable transmitter installation such as when gas 44 is the process fluid itself. However, in other embodiments, gas source 44 is an external tank of pressurized gas. For example, remote process applications often use pneumatically actuated valves to control flow. Typically, either a compressed air source or natural gas source drives these actuators. This pressurized gas source could be utilized as gas source 44 for the field device.

Figure 5:
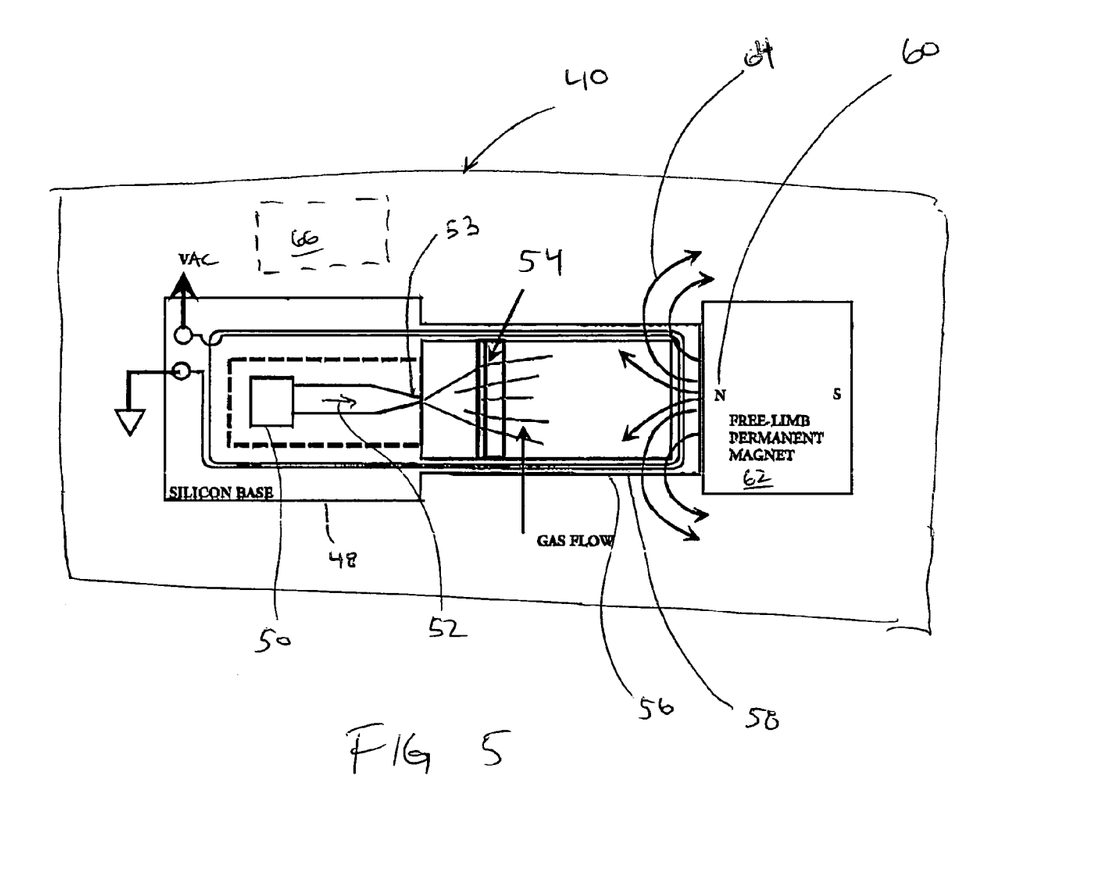
FIGS. 5 and 6 are diagrammatic views of a power supply module converting pressurized gas into electricity in accordance with embodiments of the present invention.

FIG. 5 is a top plan view of power supply module 40 in accordance with an embodiment to the present invention. Power supply module 40 includes a base 48 that is fluidically coupled (not shown) to a source of pressurized gas. Base 48 is formed of a material that facilitates MEMS construction, such as silicon. Pressurized gas fills chamber 50 and flows in the direction of arrow 52 through nozzle 53 and ultimately flows over bluff body 54 and causing cantilever member 56 to oscillate in an up and down motion (into and out of the plane of the drawing). Nozzle 53 increases the efficiency of energy conversion since it causes an localized increase in gas velocity, thereby increasing the kinetic energy of the gas. Examples of pressurized gas include air, natural gas and process gas. Cantilever member 56 may include electrical traces or conductors 58 disposed thereon and arranged to be proximate a pole 60 of a permanent magnet 62. When cantilever member 56 oscillates in the proximity of permanent magnet 62, conductors 58 moving within the magnetic field 64 generate an electric current along conductor 58. This electric current can be provided directly to power regulation circuitry for ultimate provision to components within transmitter 12, or can be coupled to an optional battery 66 (indicated in phantom in FIG. 5). Illustratively, bluff body 54 has a triangularly shaped cross-section, as indicated in FIG. 6, but can include any suitable shape including, without limitation, a cylinder, an air-foil shape, an ellipse shape, and a spherical shape.

Figure 6:
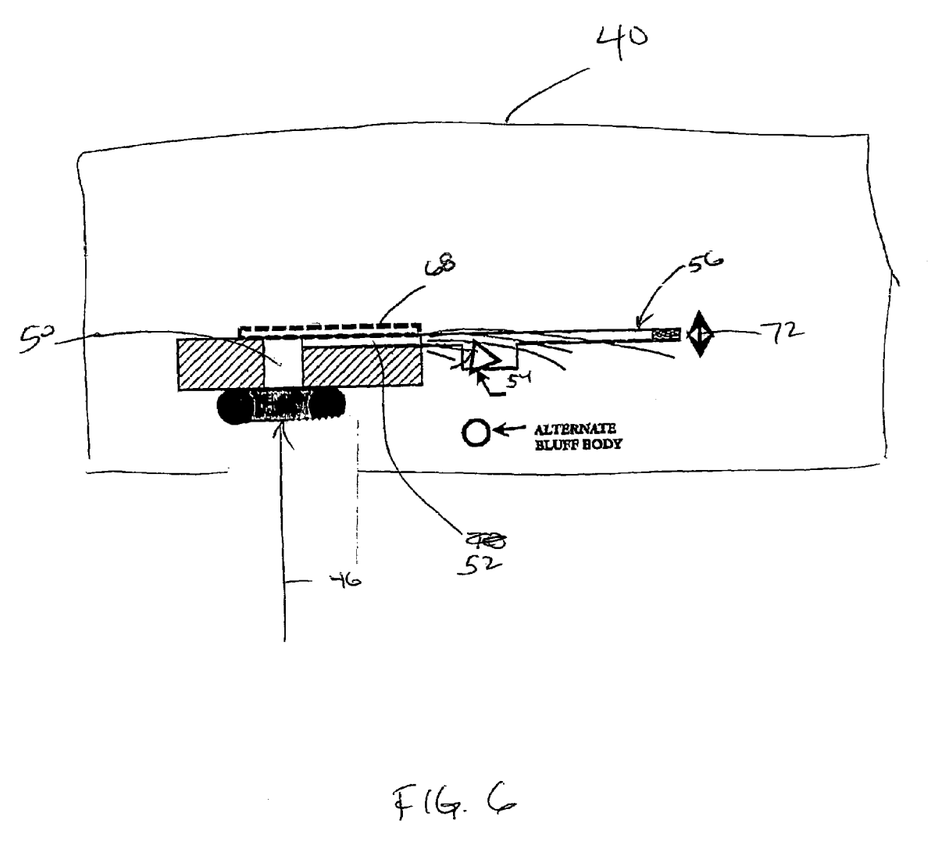

FIG. 6 is a front elevation view of power supply module 40 in accordance with an embodiment of the present invention. FIG. 6 illustrates line 46 coupling to chamber 50 which is bound on its top surface by cover layer 68 which is preferably formed of Pyrex and diffusion bonded to base 48. The pressurized gas passes along passageway 52, preferably through a nozzle, and flows over bluff body 54. The oscillation of cantilever member 56 is illustrated by double-headed vertical arrow 72. While embodiments of the present invention preferably use a permanent magnet and conductor moving upon cantilever member 56, embodiments of the present invention can also be practiced using a piezoelectric material disposed within or along cantilever member 56. In any event, embodiments of the present invention transform oscillation of cantilever member 56 into electricity. This electricity is then provided to components of the field device, either directly or indirectly.

Figure 7:
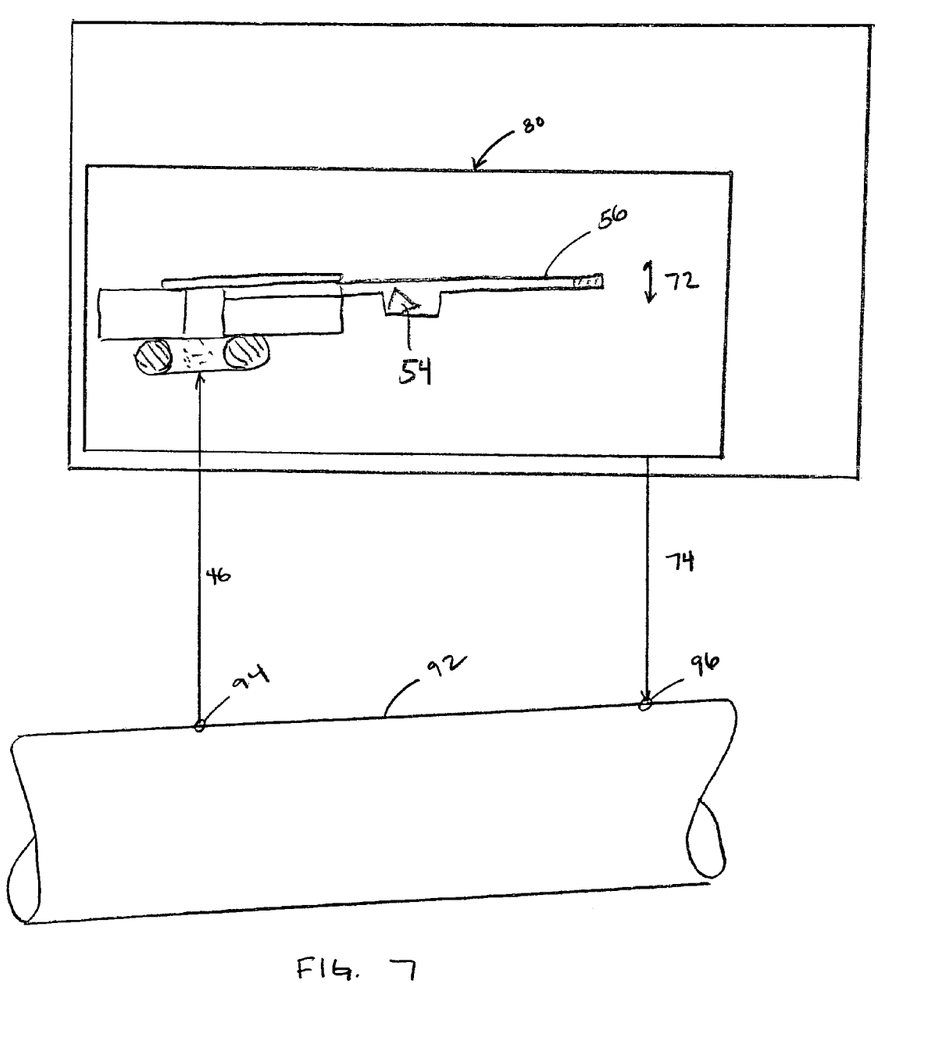
FIG. 7 is a diagrammatic view of a field in accordance with an embodiment of the present invention.

FIG. 7 is a diagrammatic view of a field device in accordance with another embodiment of the present invention. Field device 90 includes power supply module 80, which is similar to power supply module 40, illustrated in FIG. 6, and like components are numbered similarly. One of the main differences between module 80 and module 40 is that module 80 is hermetically sealed such that the pressurized gas flowing past bluff body 54, which generates the oscillation of cantilever member 56, is ultimately recaptured and passed through port 74 which is preferably coupled to the process. FIG. 7 illustrates module 80 being coupled to a pair of process pressure points on piping 92. As process fluid flows within piping 92, a differential pressure will exist between points 94 and 96. This differential pressure can be increased, if desired, by placing a suitable flow obstruction within piping 92 between points 94 and 96 As long as a differential pressure exists points 94 and 96, module 80 will operate. Accordingly, module 80 can be employed in a completely sealed system to generate electricity in response to process gas flowing in response to differential pressure. Additionally, since the amount of electricity generated will be related to the differential pressure observed between process pressure points 94 and 96, the amount of electricity generated in module 80 can be used as an indication of that differential pressure. The differential pressure is also related to the flow in piping 92. Thus, the electricity generated by module 80 can be used as an indication of the fluid flow rate in piping 92. Finally, since embodiments of the present invention allow field devices to be powered by pressurized gas, and provide indications of process fluid flow, embodiments of the present invention can be used to provide process powered flow sensors.

All of the structures indicated on FIGS. 5 and 6 are preferably constructed from materials that facilitate MEMS fabrication. Examples of such material include silicon, Pyrex, and any other suitable materials. MEMS fabrication techniques and methodologies are well known.

Although the present invention has been described with reference to preferred embodiments, workers skilled in the art will recognize that changes may be made in form and detail without departing from the spirit and scope of the invention.

What is claimed is:

1. A power supply module for generating electricity in a field device, the module comprising:
   a support structure coupleable to a source of pressurized gas, the support structure adapted to direct the pressurized gas;
   a flexure mounted relative to the support structure, the flexure including a cantilever structure having one end that oscillates in response to gas flow;
   an electrical conductor positioned on the flexure proximate the cantilever end and being electrically coupleable to components within the field device;
   a magnetic field disposed proximate the cantilever end such that oscillation of the cantilever end generates electricity in the conductor; and
   an energy storage device electrically coupled to a trace, wherein both, the energy storage device and the trace are located within the module.

2. The module of claim 1, wherein the flexure further includes a bluff body.

3. The module of claim 2, wherein the bluff body has a triangular cross-section.

4. The module of claim 2, wherein the bluff body has an air foil-shaped cross-section.

5. The module of claim 2, wherein the bluff body has an elliptically shaped cross-section.

6. The module of claim 2, wherein the bluff body has a cylindrical shape.

7. The module of claim 2, wherein the bluff body has a spherical shape.

8. The module of claim 1, wherein the magnetic field is generated by a permanent magnet disposed proximate the flexure.

9. The module of claim 1, wherein the energy storage device is a battery.

10. The module of claim 1, wherein the energy storage device is a capacitor.

11. The module of claim 1, wherein the gas is air.

12. The module of claim 1, wherein the gas is natural gas.

13. The module of claim 1, and further comprising a nozzle disposed relative to the support structure to direct the pressurized gas, and to increase the velocity of the gas.

14. The module of claim 1, wherein the field device is a transmitter for measuring a process variable.

15. The module of claim 14, wherein the source of pressurized gas is the process fluid to be measured by the transmitter.

16. The module of claim 1, wherein the field device is an actuator.

17. The module of claim 1, wherein the module is a MEMS power supply module.

18. The module of claim 1, wherein the energy storage device is a battery.

19. The module of claim 1, wherein the energy storage device is a capacitor.

20. A power supply module for generating electricity in a field device, the module comprising:
   a support structure coupleable to a source of pressurized gas, the support structure adapted to direct the pressurized gas;
   a flexure mounted relative to the support structure, the flexure including a cantilever structure having one end that oscillates in response to the directed pressurized gas flow; and a piezoelectric material mounted relative to the cantilever end such that oscillation of the cantilever end generates electricity from the piezoelectric material, the piezoelectric material being electrically coupleable to components within the field device; and
   an energy storage device coupled to the piezoelectric material, wherein both, the energy storage device and the piezoelectric material are located within the module.

21. The module of claim 20, wherein the flexure further includes a bluff body.

22. The module of claim 21, wherein the bluff body has a triangular cross-section.

23. The module of claim 21, wherein the bluff body has an air foil-shaped cross-section.

24. The module of claim 21, wherein the bluff body has an elliptically shaped cross-section.

25. The module of claim 21, wherein the bluff body has a cylindrical shape.

26. The module of claim 21, wherein the bluff body has a spherical shape.

27. The module of claim 20, wherein the gas is air.

28. The module of claim 20, wherein the gas is natural gas.

29. The module of claim 20, wherein the field device is a transmitter for measuring a process variable.

30. The module of claim 29, wherein the source of pressurized gas is the process fluid to be measured by the transmitter.

31. The module of claim 20, wherein the field device is an actuator.

32. The module of claim 20, and further comprising a nozzle disposed relative to the support structure to direct the pressurized gas, and to increase the velocity of the gas.

33. The module of claim 20, wherein the module is a MEMS power supply module.

* * * * *

UNITED STATES PATENT AND TRADEMARK OFFICE
CERTIFICATE OF CORRECTION

PATENT NO.         : 6,975,043 B2
APPLICATION NO. : 10/745310
DATED              : December 13, 2005
INVENTOR(S)        : Schumacher et al.

It is certified that error appears in the above-identified patent and that said Letters Patent is hereby corrected as shown below:

Please replace Figures 4, 5, 6, and 7 filed December 22, 2003 with the following attached Figures 4, 5, 6, and 7. SEE ATTACHED SHEETS Signed and Sealed this Twenty-eighth Day of November, 2006

JON W. DUDAS
*Director of the United States Patent and Trademark Office*